US009530622B2

(12) United States Patent
Fukasawa et al.

(10) Patent No.: US 9,530,622 B2
(45) Date of Patent: Dec. 27, 2016

(54) SPUTTERING DEVICE AND GAS SUPPLY PIPE FOR SPUTTERING DEVICE

(71) Applicant: Samsung Display Co., Ltd., Yongin, Gyeonggi-do (KR)

(72) Inventors: Takayuki Fukasawa, Seoul (KR); Yeon-Keon Moon, Seoul (KR); Sang-Woo Sohn, Yongin-si (KR); Katsushi Kishimoto, Hwaseong-si (KR); Sang-Won Shin, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 69 days.

(21) Appl. No.: 14/536,317

(22) Filed: Nov. 7, 2014

(65) Prior Publication Data

US 2015/0200077 A1 Jul. 16, 2015

(30) Foreign Application Priority Data

Jan. 13, 2014 (KR) ........................ 10-2014-0004121

(51) Int. Cl.
*H01J 37/34* (2006.01)
*H01J 37/32* (2006.01)

(52) U.S. Cl.
CPC ............ *H01J 37/3244* (2013.01); *H01J 37/34* (2013.01); *H01J 37/3405* (2013.01)

(58) Field of Classification Search
CPC ..... H01J 37/3244; H01J 37/34; H01J 37/3405
USPC ........................................ 204/298.07, 298.14
See application file for complete search history.

(56) References Cited

U.S. PATENT DOCUMENTS

| | | | | |
|---|---|---|---|---|
| 5,228,968 | A * | 7/1993 | Zejda | C23C 14/3464 204/192.12 |
| 5,622,606 | A * | 4/1997 | Kugler | C23C 14/0063 204/192.12 |
| 7,708,866 | B2 * | 5/2010 | Kim | C23C 14/3464 204/192.12 |
| 2011/0168553 | A1 | 7/2011 | Choi et al. | |
| 2012/0168301 | A1 | 7/2012 | Fahland et al. | |
| 2013/0001076 | A1 | 1/2013 | Fujisato et al. | |
| 2013/0015057 | A1 | 1/2013 | Perraud et al. | |
| 2014/0076714 | A1 | 3/2014 | Hwang et al. | |

FOREIGN PATENT DOCUMENTS

| | | | |
|---|---|---|---|
| JP | 03-115565 | * | 5/1991 |
| JP | 2006-249576 | A | 9/2006 |
| KR | 10-2010-0137192 | A | 12/2010 |

(Continued)

*Primary Examiner* — Rodney McDonald
(74) *Attorney, Agent, or Firm* — Knobbe, Martens, Olson & Bear, LLP

(57) ABSTRACT

A sputtering device and a gas supply pipe for a sputter device are disclosed. In one aspect, the sputtering device includes a chamber, a stage located in the chamber and configured to receive a substrate thereon, and a plurality of gas supply pipes arranged substantially parallel to each other. The gas supply pipes have a plurality of gas supply holes and the gas supply pipes are configured to supply gas into the chamber. The sputtering device further includes at least one exhaust pump placed at a side of the chamber, wherein the exhaust pump is substantially symmetrically arranged with respect to a center axis of the side of the chamber.

20 Claims, 9 Drawing Sheets

(56) References Cited

FOREIGN PATENT DOCUMENTS

| | | | |
|---|---|---|---|
| KR | 10-2011-0082320 | A | 7/2011 |
| KR | 10-2014-0036765 | A | 3/2014 |
| WO | WO 98/53116 | A1 | 11/1998 |

* cited by examiner

SPUTTERING DEVICE AND GAS SUPPLY PIPE FOR SPUTTERING DEVICE

CROSS-REFERENCE TO RELATED APPLICATION(S)

This application claims priority under 35 USC §119 to Korean Patent Applications No. 10-2014-0004121, filed on Jan. 13, 2014 in the Korean Intellectual Property Office (KIPO), the contents of which are incorporated herein in its entirety by reference.

BACKGROUND

Field

The described technology generally relates to a sputtering device and a gas supply pipe for the sputtering device.

Description of the Related Technology

Sputtering is a method used for forming thin films on a substrate such as a glass substrate or a silicon wafer. A sputtering gas is supplied to the vacuum chamber and a target material is ejected from a target through collision with the sputtering gas and is deposited on the substrate, thereby forming the thin film. Generally, a noble gas such as argon is used as the sputtering gas. To manufacture thin films which include an oxide or a nitride, a reactive gas such as oxygen or nitrogen is added along with the noble gas.

In the standard sputtering device, power is applied via a cathode to the target and via an anode to the substrate. When the power is applied to the device, the sputtering gas receives electrons emitted from the cathode and is excited form plasma. The plasma is attracted to the target due to the charge of the cathode and impacts the target. The plasma is spread over the target and the target material is ejected from the target when the atoms of the plasma collide with the target with sufficient energy. A portion of the freed target atoms are deposited onto the substrate positioned, thereby forming the thin film.

SUMMARY OF CERTAIN INVENTIVE ASPECTS

One inventive aspect is a plasma treatment device, a sputtering device, and a gas supply pipe for the sputtering device.

Another aspect is a sputtering device which can form a substantially uniform thin film.

Another aspect is a gas supply pipe for the sputtering device that can substantially uniformly emit the gas.

Another aspect is a sputtering device including a chamber, a stage located in the chamber, at least one target located opposite the stage, a plurality of gas supply pipes arranged substantially parallel to each other, and at least one exhaust pump arranged on at least one side of the chamber. A substrate may be loaded into the stage. The gas supply pipes may have a plurality of gas supply holes. The gas supply pipes may be configured to supply a gas from outside of the chamber to inside of the chamber. The at least one exhaust pump may be symmetrically arranged with respect to a center axis of the side of the chamber to substantially uniformly exhaust the gas.

The at least one exhaust pump may be arranged on the side of the chamber which is located in a second direction opposite to a first direction in which the stage is located with respect to the target.

The gas supply pipes may be located between the target and the stage.

The gas supply pipes may emit the gas toward the target.

The gas supply pipes may emit the gas toward the stage.

The gas supply pipes may be located on a plane on which the target is located and may emit the gas toward the stage.

The gas supply pipes may be located behind the stage with respect to the target and emit the gas toward the stage.

Each of the gas supply pipes may include a first inner pipe, a third inner pipe, and a fourth inner pipe. The first inner pipe may have a plurality of gas tunnels which are formed on a surface of the first inner pipe and a plurality of first holes which are formed in a straight line on the surface of the first inner pipe. The first holes may be respectively connected to the gas tunnels. The cross sectional areas of the gas tunnels may be substantially proportional to lengths of the gas tunnels. The third inner pipe may have one or more third holes which are connected to the first holes to receive the gas from the first holes. The fourth inner pipe may have a plurality of fourth holes which are connected to the third holes to receive the gas from the third holes. The fourth holes may substantially uniformly emit the gas to an outside of each of the gas supply pipes.

Each of the gas supply pipes may further include a second inner pipe which is located between the first inner pipe and the third inner pipe. The second inner pipe may have a plurality of second holes which are respectively connected to the first holes.

Each of the first inner pipe, the second inner pipe, the third inner pipe, and the fourth inner pipe may be formed of one or more of aluminum oxide ($Al_2O_3$), SUS304 stainless steel, hard anodized aluminum, titanium (Ti), and ceramics.

The number of the third holes is equal to the number of the first holes, the third holes are respectively connected to the first holes, and the areas of the third holes are greater than the areas of the first holes.

The gas supply pipes may be connected to a ground voltage.

The gas supply pipes may be connected to a DC power supply voltage or an AC power supply voltage to be heated by the DC power supply voltage or the AC power supply voltage.

Another aspect is gas supply pipe including a first inner pipe, a third inner pipe, and a fourth inner pipe. The first inner pipe may have a plurality of gas tunnels which are formed on a surface of the first inner pipe and a plurality of first holes which are formed in a straight line on the surface of the first inner pipe. The first holes may be respectively connected to the gas tunnels. The cross sectional areas of the gas tunnels may be substantially proportional to the lengths of the gas tunnels. The third inner pipe may have one or more third holes which are connected to the first holes to receive a gas from the first holes. The fourth inner pipe may have a plurality of fourth holes which are connected to the third holes to receive the gas from the third holes. The fourth holes may substantially uniformly emit the gas to an outside of the gas supply pipe.

The gas supply pipe further includes a second inner pipe which is located between the first inner pipe and the third inner pipe. The second inner pipe may have a plurality of second holes which are respectively connected to the first holes.

Each of the first inner pipe, the second inner pipe, the third inner pipe, and the fourth inner pipe may be formed of one or more of aluminum oxide ($Al_2O_3$), SUS304 stainless steel, hard anodized aluminum, titanium (Ti), and ceramics.

Each cross section of the gas tunnels may have a substantially circular shape and the gas tunnels may be configured to satisfy Equation 1.

$$\frac{d_1^3}{l_1} = \frac{d_2^3}{l_2} = k \qquad \text{[Equation 1]}$$

where $d_1$ is the diameter of a first one of the gas tunnels, $l_1$ is the length of the first one of the gas tunnels, $d_2$ is the diameter of a second one of the gas tunnels, $l_2$ is the length of the second one of the gas tunnels, and k is a constant The number of the third holes is equal to the number of the first holes, the third holes are respectively connected to the first holes, and the areas of the third holes are greater than the areas of the first holes.

The gas supply pipe may further include a connection pipe connected to an end of the fourth inner pipe. The first inner pipe may further have a penetration tunnel which is placed along a center axis of the first inner pipe to deliver the gas to the connection pipe.

The cross section of the penetration tunnel may be substantially inversely proportional to the distance over which the gas is delivered.

Another aspect is a sputtering device including a chamber a stage located in the chamber and configured to receive a substrate thereon, a plurality of gas supply pipes arranged substantially parallel to each other, wherein the gas supply pipes have a plurality of gas supply holes and wherein the gas supply pipes are configured to supply gas into the chamber, and at least one exhaust pump placed at a side of the chamber, wherein the exhaust pump is substantially symmetrically arranged with respect to a center axis of the side of the chamber.

At least one target opposing the stage can be interposed between the exhaust pump and the stage. The gas supply pipes can be interposed between the target and the stage. The gas supply pipes can be configured to emit the gas toward the target or the stage. The at least one target can include a plurality of targets and wherein the gas supply pipes are alternately arranged with the targets. The gas supply pipes can be located behind the stage and can be configured to emit the gas toward the stage and the target can be interposed between the gas supply pipes and the stage. Each of the gas supply pipes can include a first inner pipe including a plurality of gas tunnels formed on a surface of the first inner pipe, wherein a plurality of first holes are formed in a substantially straight line on the surface of the first inner pipe, wherein the first holes are respectively connected to the gas tunnels, and wherein the cross sectional areas of the gas tunnels are substantially proportional to the lengths of the gas tunnels, a third inner pipe having one or more third holes connected to the first holes and configured to receive the gas from the first holes, and a fourth inner pipe having a plurality of fourth holes connected to the third holes and configured to i) receive the gas from the third holes and ii) emit the received gas.

Each of the gas supply pipes can further include a second inner pipe which interposed between the first inner pipe and the third inner pipe and each of the second inner pipes can have a plurality of second holes respectively connected to the first holes. Each of the first, second, third, and fourth inner pipes can be formed of one or more of aluminum oxide ($Al_2O_3$), SUS304 stainless steel, hard anodized aluminum, titanium (Ti), and ceramics. The number of the third holes can equal the number of the first holes, wherein the third holes are respectively connected to the first holes, and wherein the areas of the third holes are greater than the areas of the first holes. The gas supply pipes can be electrically connected to a ground voltage. The gas supply pipes can be electrically connected to a DC power supply voltage or an AC power supply voltage.

Another aspect is gas supply pipe for a sputtering device including a first inner pipe including a plurality of gas tunnels formed on a surface of the first inner pipe, wherein a plurality of first holes are formed in a substantially straight line, wherein the first holes are respectively connected to the gas tunnels, and wherein the cross sectional areas of the gas tunnels are substantially proportional to the lengths of the gas tunnels, a third inner pipe having one or more third holes connected to the first holes and configured to receive a gas from the first holes, and a fourth inner pipe having a plurality of fourth holes connected to the third holes and configured to receive the gas from the third holes and emit the received gas.

The gas supply pipe can further include a second inner pipe interposed between the first inner pipe and the third inner pipe, wherein the second inner pipe has a plurality of second holes respectively connected to the first holes.

The cross section of each of the gas tunnels can have a substantially circular shape and wherein the gas tunnels satisfy Equation 1.

$$\frac{d_1^3}{l_1} = \frac{d_2^3}{l_2} = k \qquad \text{[Equation 1]}$$

where $d_1$ is the diameter of a first one of the gas tunnels, $l_1$ is the length of the first one of the gas tunnels, $d_2$ is the diameter of a second one of the gas tunnels, $l_2$ is the length of the second one of the gas tunnels, and k is a constant.

The gas supply pipe can further include a connection pipe connected to an end of the fourth inner pipe, wherein the first inner pipe further includes a penetration tunnel arranged along a center axis of the first inner pipe and configured to deliver the gas to the connection pipe. The cross sectional area of the penetration tunnel can be substantially inversely proportional to the length of the penetration tunnel.

Another aspect is a sputtering device including a chamber, a stage located in the chamber and configured to receive a substrate thereon, and a plurality of gas supply pipes located in the chamber and arranged substantially parallel to each other, wherein each of the gas supply pipes comprises a plurality of inner pipes, wherein each inner pipe has at least one hole formed on a surface thereof, and wherein the holes of the inner pipes of the same gas supply pipe are respectively connected to each other.

The inner pipes of each of the gas supply pipes can include a first inner pipe including a plurality of gas tunnels formed on the surface thereof and wherein the cross sectional areas of the gas tunnels are substantially proportional to the lengths of the gas tunnels. The holes of each the inner pipes of the same supply pipe can have different areas from each other.

According to at least one embodiment, a sputtering device can substantially uniformly supply the sputtering gas and the reactive gas into the chamber using the gas supply pipes arranged in substantially parallel to each other. Also, the sputtering device may substantially uniformly exhaust the sputtering gas and the reactive gas from the chamber using the exhaust pumps that are symmetrically arranged with respect to a center axis of the side of the chamber. Therefore, the sputtering device forms a uniform thin film on the substrate surface by maintaining a constant concentration of the reactive gas in the chamber.

In addition, the gas supply pipe for the sputtering device according to embodiments substantially uniformly emits the gas by including the inner pipes having a multi-layer structure.

DETAILED DESCRIPTION OF CERTAIN INVENTIVE EMBODIMENTS

In the standard sputtering device, the sputtering gas is supplied into the chamber by a single gas supply pipe connected one side of the chamber. Also, the sputtering gas is exhausted from the chamber by a single exhaust pump connected one side of the chamber. Thus, in such a sputtering device, thin films are not uniformly formed by in reactive sputtering, because it is difficult to maintain a constant concentration of the reactive gas within the vacuum chamber.

Exemplary embodiments will be described more fully hereinafter with reference to the accompanying drawings, in which various embodiments are shown.

Figure 1:
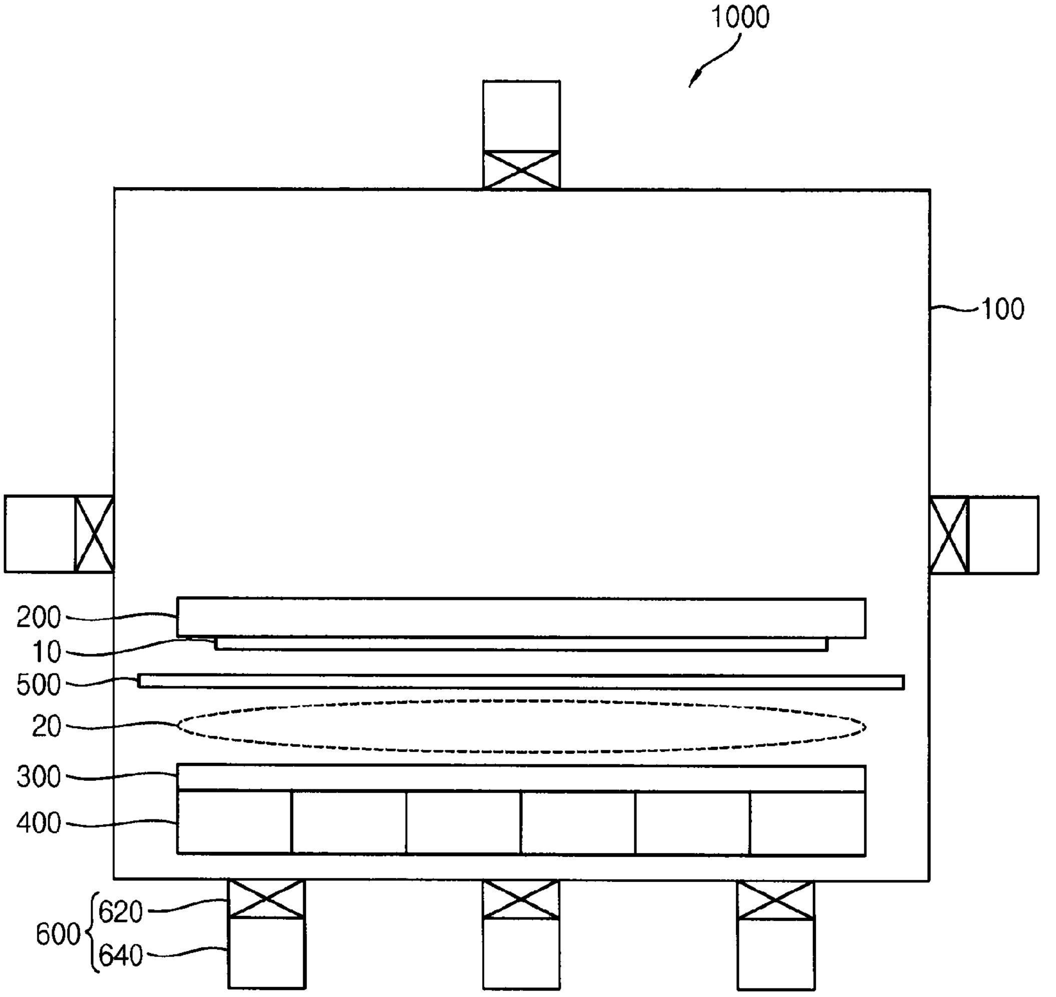
FIG. 1 is a front view illustrating a sputtering device according to an embodiment.

FIG. 1 is a front view illustrating a sputtering device according to an embodiment.

Referring to FIG. 1, the sputtering device 1000 includes a chamber 100, a stage 200, at least one target 300, a plurality of gas supply pipes 500, and at least one exhaust pump 600.

The chamber 100 has an enclosed space to form plasma 20. The chamber 100 is a vacuum chamber for performing a sputtering process. The chamber 100 further includes a space into which a substrate 10 is placed.

The stage 200 is located in the chamber 100. The substrate 10 is loaded onto the stage 200. The stage 200 includes a transfer unit that transfers the substrate 10 to the stage 200 and a fixing unit that fixes the substrate 10 to the stage 200.

The target 300 is located opposite the stage 200. In some embodiments, the target 300 is spaced about 30 cm from the stage 200 in order to substantially uniformly form the thin film. The sputtering device 1000 can have one target 300 or a plurality of targets 300 that are spaced apart from each other. When the sputtering device 1000 has a single target 300, the thin film can be substantially uniformly formed. When the sputtering device 1000 has a plurality of targets 300, the distances between targets 300 can be minimized to substantially uniformly form the thin film. The target 300 may be formed of metal or nonmetal elements. Generally, in the sputtering device 1000 for manufacturing the display device, the target 300 may be formed of metal or a metal-oxide. For example, the target 300 may be formed of metal such as aluminum (Al), copper (Cu), etc. The target 300 may include metal-oxide such as indium tin oxide (ITO), indium zinc oxide (IZO), Indium Tin Zinc Oxide (ITZO), Tin Zinc Oxide (TZO), etc.

In some embodiments, the gas supply pipes 500 are arranged substantially parallel to each other. The gas supply pipes 500 have a plurality of gas supply holes to substantially uniformly supply the gas into the chamber 100. The gas supply pipes 500 are arranged to maintain a substantially constant concentration of the process gas. In a reactive sputtering process, when the concentration of reactive gas is not constant in the chamber 100, the thin film may be not uniformly formed. Therefore, the sputtering device 1000 includes the gas supply pipes 500 that are arranged substantially parallel to each other in order to maintain a substantially constant concentration of the process gas, thereby substantially uniformly forming the thin film. In one example embodiment, the gas supply pipes 500 are located between the target 300 and the stage 200. In this embodiment, the gas supply pipes 500 emit the gas toward the target 300 or the stage 200. The gas supply pipes 500 emit the gas in a direction in which the reactive gas is to be reacted. For example, the gas supply pipes 500 emit the gas in a direction in which the reaction is to be performed. In another embodiment, the gas supply pipes 500 are located on a plane in which the target 300 is located and emit the gas toward the stage 200. Thus, when the targets 300 are spaced apart from each other, the gas supply pipes 500 are arranged beside the targets 300 and emit the gas toward the stage 200. In still another embodiment, the gas supply pipes 500 are located behind the target 300 and opposing the stage 200 and emit the gas toward the stage 200. When the gas supply pipes 500 are arranged behind the target 300, it is easy to ensure sufficient space for placement of the gas supply pipes 500.

Each of the gas supply pipes 500 includes inner pipes forming a multi-layer structure and substantially uniformly emit the gas from the gas supply pipes 500. In one embodiment, each of the gas supply pipes 500 includes a first inner pipe, a third inner pipe, and a fourth inner pipe. The first inner pipe has a plurality of gas tunnels formed on a surface of the first inner pipe and a plurality of first holes formed in a straight line on the surface of the first inner pipe. The first holes are respectively connected to the gas tunnels. The first hole is defined as a terminal of the gas tunnel that is formed on a side surface of the first inner pipe. In one embodiment, the size or area of the first hole is substantially equal to the size or area of the gas tunnel. In another embodiment, the first hole has various sizes in order to be connected to the third hole included in the third inner pipe.

The cross sectional areas of the gas tunnels may be in proportion to the lengths of the gas tunnels. The third inner pipe may have one or more third holes which are connected to the first holes to receive the gas from the first holes. In some embodiments, the number of third holes equals the number of first holes, the third holes are respectively connected to the first holes, and the sizes of the third holes are greater than the sizes of the first holes. The fourth inner pipe may have a plurality of fourth holes which are connected to the third holes to receive the gas from the third holes. The fourth holes substantially uniformly emit the gas from the gas supply pipes 500.

In some embodiments, each of the gas supply pipes 500 further includes a second inner pipe located between the first and third inner pipes. The second inner pipe may have a plurality of second holes which are respectively connected to the first holes. In one embodiment, each of the first inner pipe, the second inner pipe, the third inner pipe, and the fourth inner pipe is formed of one or more material of aluminum oxide ($Al_2O_3$), SUS304 stainless steel, hard anodized aluminum, titanium (Ti), and ceramics. In another embodiment, the gas supply pipe 500 includes the same or a similar material to a material included in the target 300. Thus, the gas supply pipe 500 may include a material corresponding to the target 300 to avoid interference with the target 300 during the sputtering process.

In some embodiments, the gas supply pipes 500 are formed of a metal and function as a ground electrode or a protection electrode. In one embodiment, the gas supply pipes 500 are electrically connected to a ground voltage. Such ground electrodes are particularly important in the sputtering process for manufacturing large display devices, in some embodiments, the gas supply pipes 500 are formed of metal and are electrically connected to a ground voltage to function as the ground electrode. When the gas supply pipes 500 are located between the target 300 and the stage 200, the plasma 20 can be stably formed by connecting the gas supply pipes 500 to the ground voltage to function as the ground electrode between the substrate 10 and the target 300.

In addition, the gas supply pipes 500 may function as a protection electrode to reduce damage caused by sparks. In another embodiment, the gas supply pipes 500 are connected to a DC power supply voltage or an AC power supply voltage to be heated by the power supply. The gas supply pipes 500 can be purified via the heating from the power supply. When the sputtering process is continually performed, the sputtered particles may be formed on the gas supply pipes 500. These deposited particles can cause defects in the thin film formed on the substrate 10. When the gas supply pipes 500 are electrically connected to a DC power supply voltage or an AC power supply voltage to be heated, the particles that are formed on the gas supply pipes 500 can be eliminated. Therefore, when the sputtering process is performed a predetermined number of times (e.g., 300 times), the gas supply pipes 500 can be disconnected to the ground voltage and electrically connected to the DC power supply voltage or the AC power supply voltage with a switch, thereby cleaning the gas supply pipes 500.

The gas supply pipes 500 can be connected to a mass flow controller (MFC) to control the amount of gas emitted. The mass flow controller is connected to a gas tank that stores the process gas. The gas tank may store the sputtering gas such as argon (Ar), xenon (Xe), etc and the reactive gas such as oxygen (02), nitrogen (N2), etc.

The exhaust pumps 600 are arranged on at least one side of the chamber 100. The exhaust pumps 600 may be symmetrically arranged with respect to a center axis of the side of the chamber 100 to substantially uniformly exhaust the gas. In one embodiment, the at least one exhaust pump 600 is arranged on the side of the chamber 100 opposite to the stage 200 with respect to the target 300. When the exhaust pumps 600 are symmetrically arranged behind the target 300, the process gas can be substantially uniformly exhausted, thereby reducing variation in the concentration of the process gas between the target 300 and stage 200.

The exhaust pump 600 includes a pressure control valve 620 and a turbo molecular pump (TMP) 640. The pressure control valve 620 is located between the chamber 100 and the turbo molecular pump 640 to control pressure. The turbo molecular pump 640 is a kind of vacuum pump and pumps the gas at a high speed to maintain a vacuum state in the chamber 100. The exhaust pump 600 may have various structures.

The sputtering device 1000 may further include a magnetic member 400 to improve the efficiency of the sputtering process. The magnetic member 400 may include a permanent magnet and may be arranged behind the target 300. When the sputtering device 1000 includes the magnetic member 400 the deposition speed of the thin film is improved by raising the ionization rate. The inclusion of the magnetic member 400 may also improve quality of the thin film. In addition, the sputtering device 1000 further includes a first electrode, a second electrode, and a power supply unit to generate the plasma 20 between the stage 200 and the target 300. The sputtering device 1000 may further include a shutter or isolation unit and a transfer unit. The shutter can isolate the substrate 10 from the target 300. The transfer unit transfers the substrate 10 to the stage 200.

Figure 2:
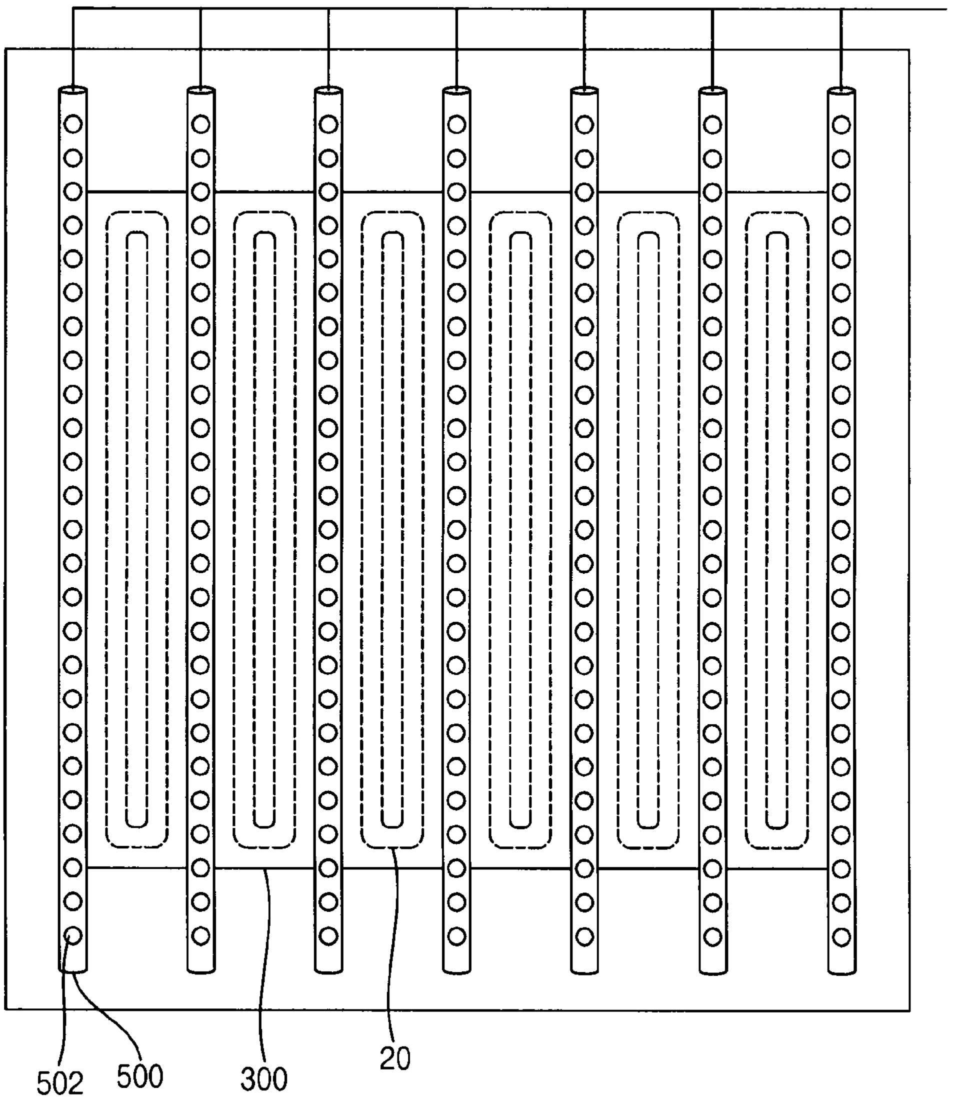
FIG. 2 is a plane view illustrating a plurality of gas supply pipes included in the sputtering device of FIG. 1.

FIG. 2 is a plane view illustrating a plurality of gas supply pipes included in the sputtering device of FIG. 1. FIGS. 3 through 6 are front views illustrating examples of deposition and gas emission directions of a plurality of gas supply pipes included in the sputtering device of FIG. 1.

Referring to FIGS. 2 through 6, the target 300 is located opposing the stage 200. In some embodiments, the target 300 is spaced about 30 cm from the stage 200 to aid in forming the thin film uniformly. When the concentration of the process gas is not constant between the target 300 and the stage 200, the thin film formed on the substrate 10 may be not sufficiently uniform. Particularly, in reactive sputtering processes, various arrangements of the gas supply pipes 500 can be employed to maintain a substantially constant concentration of the reactive gas since reactive sputtering is sensitive to the concentration of the reactive gas.

Figure 3:
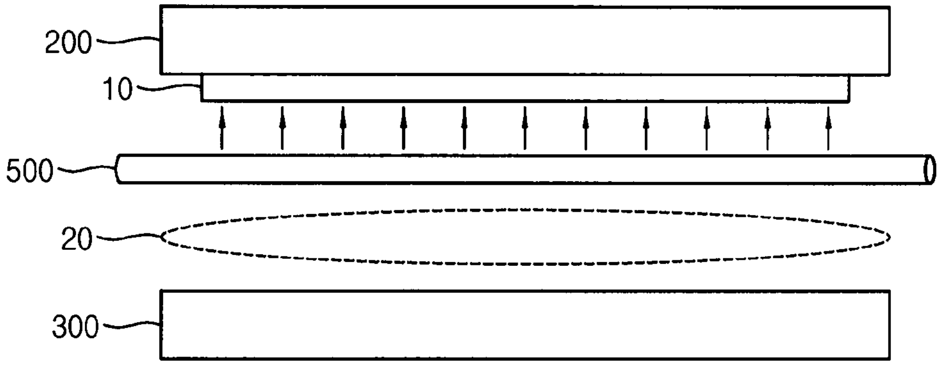
FIGS. 3 through 6 are front views illustrating examples of deposition and gas emission direction of a plurality of gas supply pipes included in the sputtering device of FIG. 1.
Figure 4:
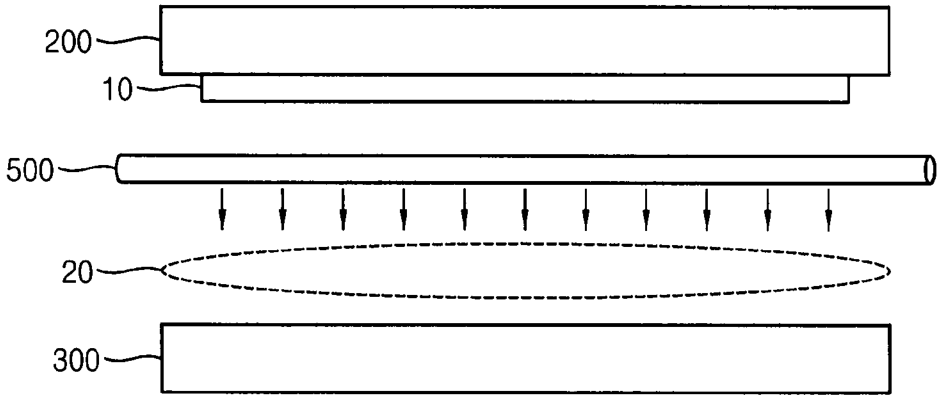

As shown in the embodiments of FIGS. 3 and 4, the gas supply pipes 500 are located between the target 300 and the stage 200. The gas supply pipes 500 emit the gas in various directions through a plurality of gas supply holes include in the gas supply pipes 500. In one embodiment, the gas supply pipes 500 emit the gas toward the target 300. In another embodiment, the gas supply pipes 500 emit the gas toward the stage 200. For example, the gas supply pipes 500 emit the gas in a direction in which the reactive gas is to be reacted. The gas supply pipes 500 may emit the gas in a direction corresponding in which the reaction is to be performed. The concentration of the process gas may be substantially uniformly maintained between the target 300 and the stage 200 by supplying the gas in the direction in which the reactive gas is to be reacted. When the gas supply pipes 500 are located between the target 300 and the stage 200, the sputtering device can have one or more targets 300. When the sputtering device has one target 300, the thin film may be substantially uniformly formed. On the other hand, when the sputtering device has the plurality of targets 300, the distances between targets 300 can be minimized to substantially uniformly form the thin film.

Figure 5:
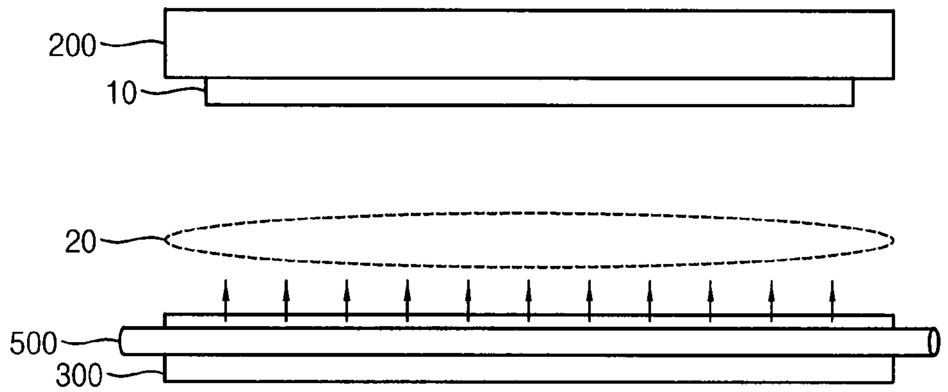

As shown in the embodiment of FIG. 5, the gas supply pipes 500 are located on a plane in which the target 300 is located and emit the gas toward the stage 200. In one embodiment, when the gas supply pipes 500 are located in the plane in which the target 300 is located, the sputtering device has a plurality of targets 300 that are spaced apart from each other and the gas supply pipes 500 are arranged between the targets 300. In another embodiment, the gas supply pipes 500 are located in the plane in which the targets 300 are located and are arranged beside the targets 300. The gas supply pipes 500 emit the gas toward the stage 200 to maintain a substantially constant concentration of the reactive gas between the target 300 and the stage 200.

Figure 6:
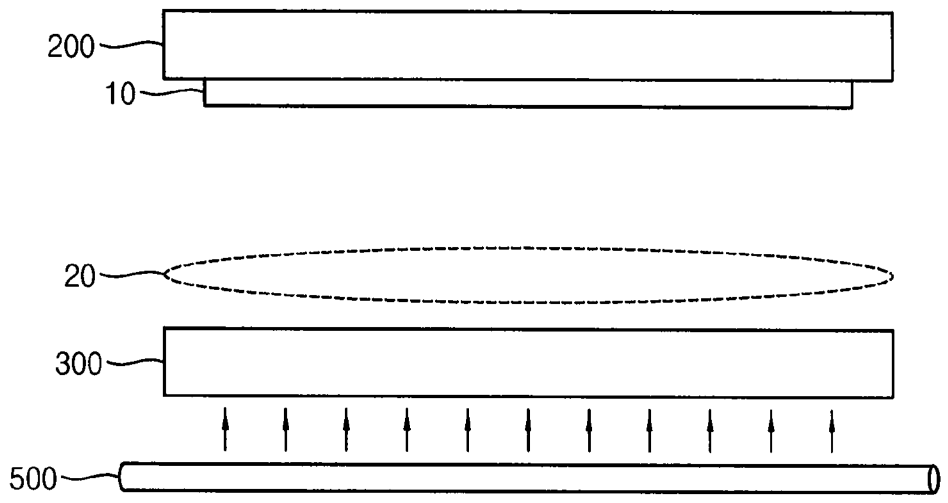

As shown in the FIG. 6 embodiment, the gas supply pipes 500 are located opposing the stage 200 with respect to the target 300 and emit the gas toward the stage 200. In one embodiment, the gas supply pipes 500 are arranged behind the target 300, the sputtering device has a plurality of targets 300 that are spaced apart from each other, and the gas supply pipes 500 emit the gas toward the stage 200 between the targets 300. In another embodiment, the gas supply pipes 500 are arranged beside the targets 300 and emit the gas toward the stage 200. When the gas supply pipes 500 are arranged behind the target 300, it is easy ensure sufficient space for the gas supply pipes 500 within the chamber 100.

Figure 7:
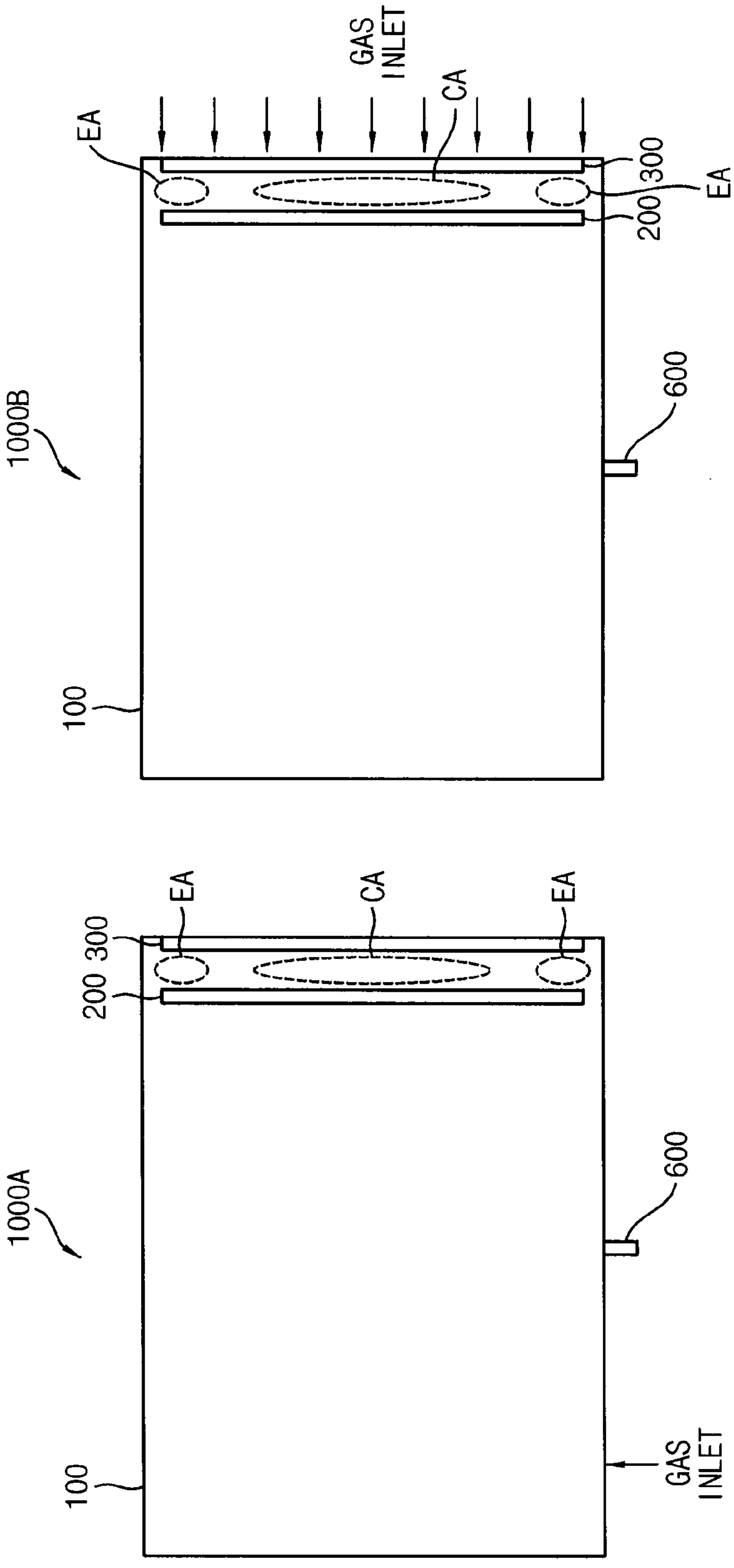
FIG. 7 is a diagram illustrating differences between the concentrations of a process gas according to different methods of supplying the gas in the sputtering device of FIG. 1.

FIG. 7 is a diagram illustrating the differences between concentrations of a process gas according to different methods of supplying the gas in the sputtering device of FIG. 1.

Referring to FIG. 7, simulations were performed for a first sputtering device 1000A and a second sputtering device 1000B. The first sputtering device 1000A supplies the process gas from a single location spaced apart from the target 300 and the stage 200. When the process gas including argon (Ar) at about 99 sccm and oxygen ($O_2$) at about 1 sccm is used and the consumption rate of oxygen is about 1%, the result of the simulation revealed a difference of in the concentration of oxygen depending on the region in the chamber 100 where the concentration is measured, while the concentration of argon is substantially uniform. Specifically, comparing an edge area EA and a center area CA between the target 300 and the stage 200, the concentration of oxygen at the edge area EA is greater than the concentration of oxygen at the center area CA by about three times. This is because the amount of oxygen consumed is greater than the amount of oxygen supplied in the center area CA, while the amount of oxygen supplied is as substantially equal to the amount of oxygen consumed in the edge area EA. Therefore, in the reactive sputtering process, the first sputtering device 1000A does not uniformly form the thin film due to the difference in the concentration of the reactive gas at the edge area EA and in the center area CA.

On the other hand, using the same conditions of the first sputtering device 1000A, the second sputtering device 1000B substantially uniformly supplied the process gas from eleven positions spaced apart from each other and located opposing the stage 200 behind the target 300. When the process gas including argon (Ar) at about 99 sccm and oxygen ($O_2$) at about 1 sccm is used and the consumption of oxygen is about 1%, the result of the simulation revealed that the concentration of oxygen and the concentration of argon are substantially uniformly maintained. Therefore, in the reactive sputtering process, when the process gas is substantially uniformly supplied between the target 300 and the stage 200 like in the second sputtering device 1000B, the concentration of the reactive gas is substantially uniformly maintained between the target 300 and the stage 200, thereby substantially uniformly forming the thin film. However, depending on the embodiment, the processing gas can include less than about 99 sccm of argon (Ar) or greater than about 99 sccm of argon (Ar). Similarly, in some embodiments, the processing gas can include greater than about 1 sccm of oxygen ($O_2$) or less than about 1 sccm of oxygen ($O_2$).

Figure 8:
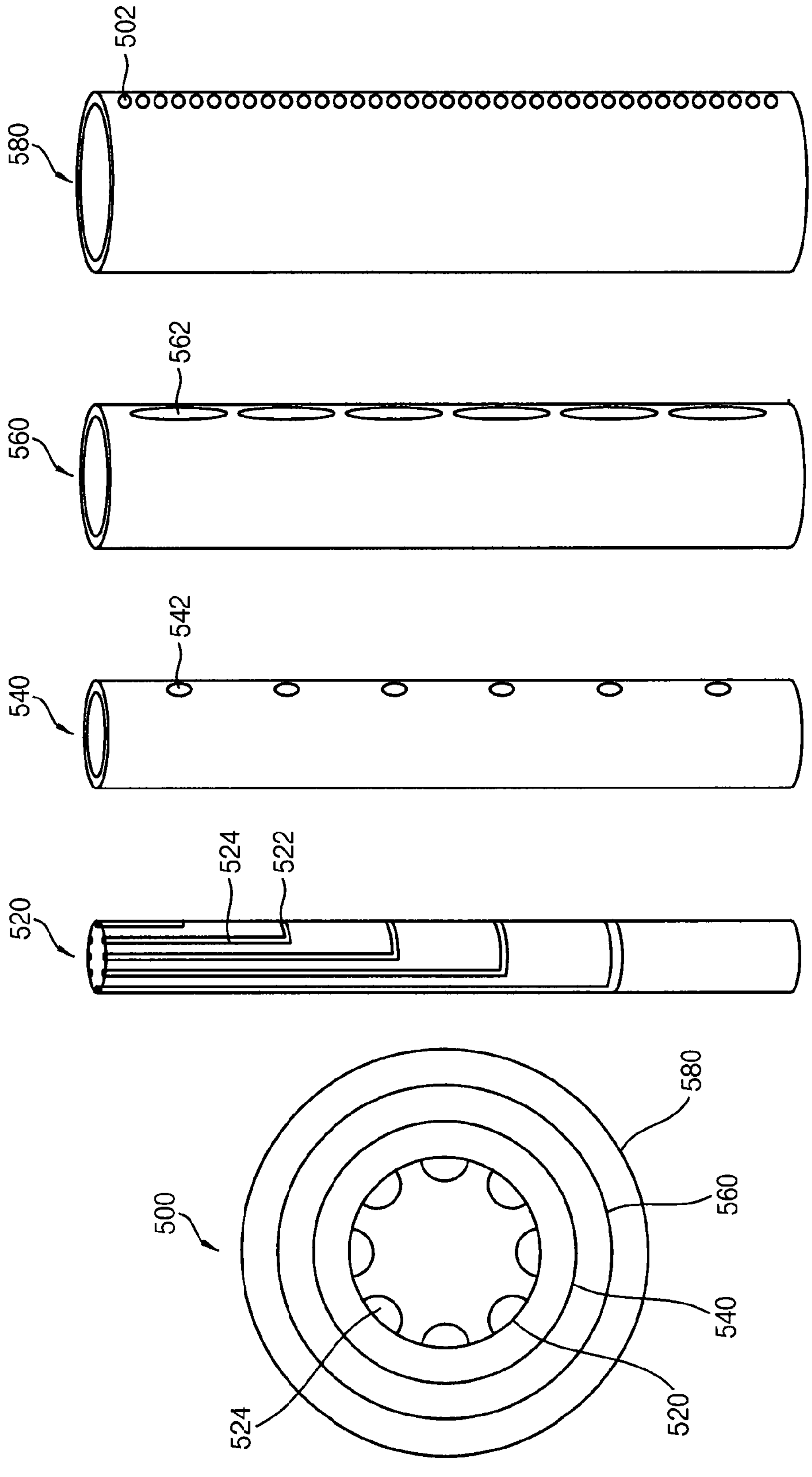
FIG. 8 is a diagram illustrating a gas supply pipe for a sputtering device according to an embodiment.

FIG. 8 is a diagram illustrating a gas supply pipe for a sputtering device according to an embodiment.

Referring to FIG. 8, the gas supply pipe 500 includes a first inner pipe 520, a second inner pipe 540, a third inner pipe 560, and a fourth inner pipe 580.

The first inner pipe 520 has a plurality of gas tunnels 524, formed on a surface of the first inner pipe 520, and a plurality of first holes 522 formed in a straight line on the surface of the first inner pipe 520. The first holes 522 are respectively connected to the gas tunnels 524. The cross sectional areas of the gas tunnels 524 are substantially proportional to the lengths of the gas tunnels 524. The first inner pipe 520 emit the gas through the gas tunnels 524 formed in a straight line on the surface of the first inner pipe 520 and the first holes 522 that are connected to the gas tunnels 524. The first holes 522 are defined as terminals of the gas tunnels 524 formed on a side surface of the first inner pipe 520. In one embodiment, the sizes of the first holes 522 are substantially equal to the sizes of the gas tunnels 524. In another embodiment, the first holes 522 have various sizes in order to be connected to the second holes 542 included in the second inner pipe 540 or the third holes 562 included in the third inner pipe 560. In some embodiments, the cross sectional areas of the gas tunnels 524 are substantially proportional to the lengths of the gas tunnels 524 in order to substantially uniformly emit the process gas from the first holes 522.

The second inner pipe 540 is located between the first inner pipe 520 and the third inner pipe 560. The second inner pipe 540 has a plurality of second holes 542 which are respectively connected to the first holes 522. Thus, the second inner pipe 540 connects the first inner pipe 520 to the third inner pipe 560. In one embodiment, the second inner pipe 540 can be omitted to simplify the structure of the gas supply pipe 500.

The third inner pipe 560 has one or more the third holes 562 which are connected to the first holes 522 to receive the gas from the first holes 522. The third holes 562 function as a buffer layer. The gas supply pipe 500 substantially uniformly emits the process gas via the first holes 522 included in the first inner pipe 520. In addition, the gas supply pipe 500 emits the process gas more uniformly via the third holes 562 which have sizes or areas that are greater than the sizes or areas of the first holes 522 in order to function as the buffer layer. Thus, the gas supply pipe 500 has a multi-layer structure that includes a first layer having narrow holes, a second layer having broad holes, and a third layer having narrow holes, in sequence, to substantially uniformly emit the process gas.

The fourth inner pipe 580 has a plurality of fourth holes 502 which are connected to the third holes 562 to receive the gas from the third holes 562. In one embodiment, the fourth holes 502 are formed in a straight line on the surface of the gas supply pipe 500 and substantially uniformly emit the gas from the gas supply pipe 500.

In one embodiment, each of the first inner pipe 520, the second inner pipe 540, the third inner pipe 560, and the fourth inner pipe 580 included in the gas supply pipe 500 is formed of one or more material of aluminum oxide ($Al_2O_3$), SUS304 stainless steel, hard anodized aluminum, titanium (Ti), and ceramics. In another embodiment, the gas supply pipe 500 is formed of the same or a similar material that of the target 300. Thus, the gas supply pipe 500 can be formed of a material corresponding to the target 300 to avoid interference with the target 300 during the sputtering process.

Figure 9:
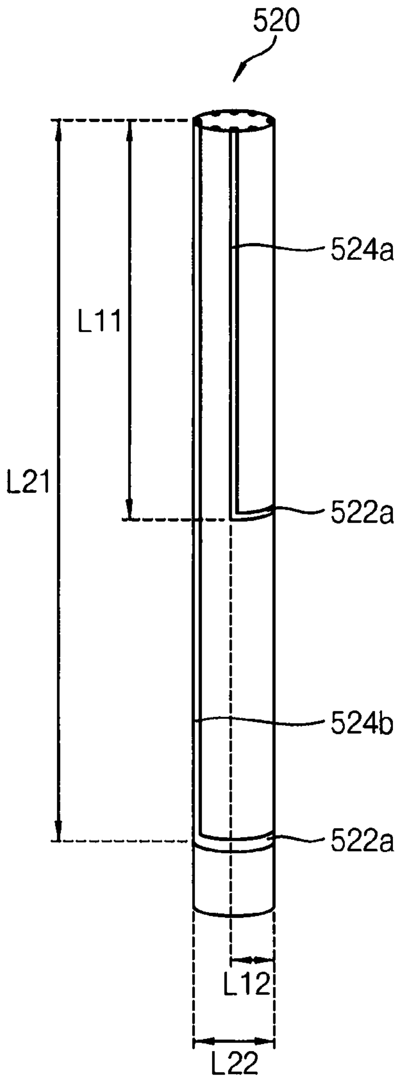
FIG. 9 is a diagram illustrating an example of a first inner pipe included in the gas supply pipe of FIG. 8.

FIG. 9 is a diagram illustrating an example of a first inner pipe included in the gas supply pipe of FIG. 8.

Referring to FIG. 9, the first inner pipe 520 has a plurality of gas tunnels 524*a* 524*b* which are formed on a surface of the first inner pipe 520 and a plurality of first holes 522*a* 522*b* which are formed in a straight line on the surface of the first inner pipe 520 and are connected to the gas tunnels 524*a* 524*b*. The cross sectional areas of the gas tunnels 524*a* 524*b* are substantially proportional to lengths of the gas tunnels 524*a* 524*b*. The first inner pipe 520 emits the gas in one direction through the gas tunnels 524*a* 524*b* and the first holes 522*a* 522*b*. In addition, the first inner pipe 520 substantially uniformly emits the gas by forming the gas tunnels 524*a* 524*b* which have cross sectional areas substantially proportional to their lengths. In one embodiment, each cross section of the gas tunnels 524*a* 524*b* has a substantially circular shape and the diameters and lengths of gas tunnels 524*a* 524*b* satisfy the following Equation 1.

$$\frac{d_1^3}{l_1} = \frac{d_2^3}{l_2} = k \qquad \text{[Equation 1]}$$

where $d_1$ is the diameter of a first one of the gas tunnels, $l_1$ is the length of the first one of the gas tunnels, $d_2$ is the diameter of a second one of the gas tunnels, $l_2$ is the length of the second one of the gas tunnels, and k is a constant.

When each cross section of the gas tunnels 524*a* 524*b* has a substantially circular shape, the volume of space of the gas tunnels 524*a* 524*b* is substantially proportional to cube of the diameter thereof. Therefore, the first inner pipe 520 satisfying the Equation 1 substantially uniformly emits the gas from each of the first holes 522*a* 522*b*.

Figure 10:
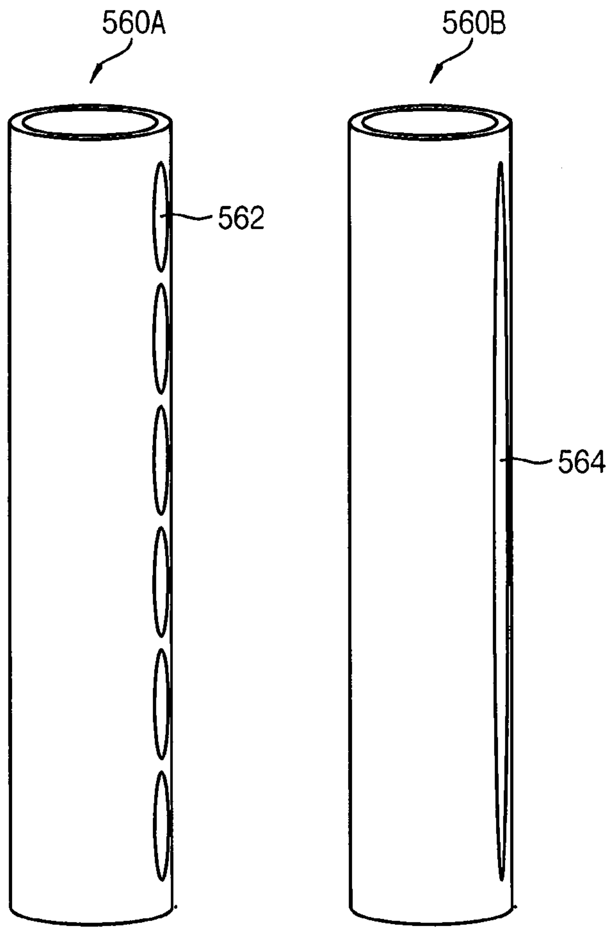
FIG. 10 is a diagram illustrating examples of a third inner pipe included in the gas supply pipe of FIG. 8.

FIG. 10 is a diagram illustrating examples of a third inner pipe included in the gas supply pipe of FIG. 8.

Referring to FIG. 10, the third inner pipe 560A, 560B has at least one the third hole 562 564 connected to the first holes or the second holes to receive the gas therefrom. The third holes 562 564 function as a buffer layer. Thus, the gas supply pipe including the third inner pipe 560A 560B having the third holes 562 564 can substantially uniformly emit the gas. In one embodiment, the third inner pipe 560A has a plurality of the third holes 562. For example, when the number of the third holes 562 equals the number of the first holes, the third holes 560 are respectively connected to the first holes and the sizes of the third holes 562 are greater than the sizes of the first holes. In another embodiment, each of the third holes 564 is connected to a plurality of the first holes. In still another embodiment, the third inner pipe 560B has only one third hole 564 and the third hole 564 is connected to all the first holes. Thus, the gas supply pipe can have various multi-layer structures that includes a first layer having narrow holes, a second layer having broad holes, and a third layer having narrow holes, in sequence, to substantially uniformly emit the gas. Here, the second layer having broad holes such as the third inner pipe 560A 560B functions as the buffer layer.

Figure 11:
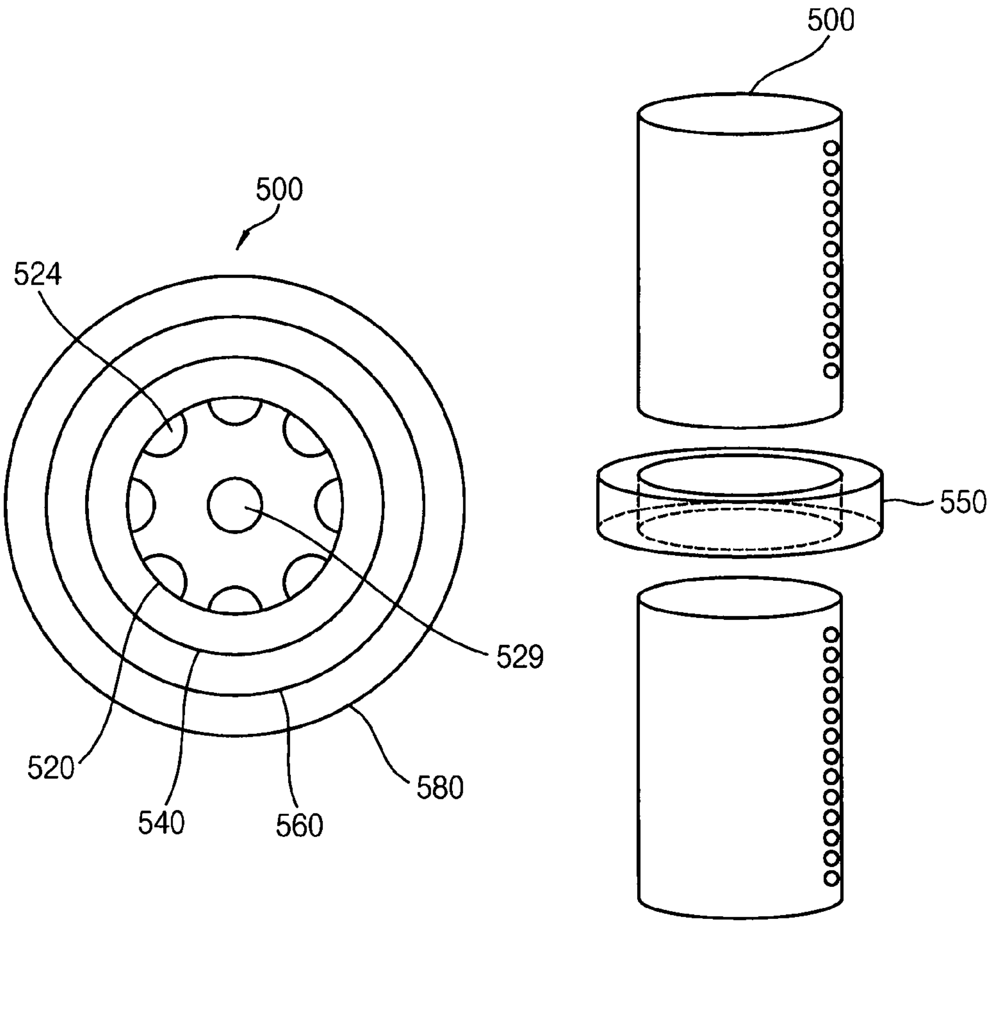
FIG. 11 is a diagram illustrating an example of the gas supply pipe of FIG. 8 that is lengthened by a connection pipe.

FIG. 11 is a diagram illustrating an example of the gas supply pipe of FIG. 8 that is lengthened by a connection pipe.

Referring to FIG. 11, the gas supply pipe 500 is lengthened by the connection pipe 550. The gas supply pipe 500 includes the first inner pipe 520, the second inner pipe 540, the third inner pipe 560, and the fourth inner pipe 580 to substantially uniformly supply the gas from the gas supply holes formed on the gas supply pipe 500. According to at least one embodiment, in order to substantially uniformly emit the gas, the first inner pipe 520 may need to gas tunnels with different cross-sectional areas and lengths. Therefore, lengthening the gas supply pipe 500 may be difficult or may increase manufacturing costs. However, the gas supply pipe 500 can be easily lengthened using the connection pipe 550. In one embodiment, the gas supply pipe 500 further includes the connection pipe 550 connected to an end of the fourth inner pipe 580 and the first inner pipe 520 further includes a penetration tunnel 529 formed along a center axis of the first inner pipe 520 to deliver the gas to the connection pipe 550. Thus, when the gas supply pipe 500 is lengthened by the connection pipe 550, the first inner pipe 520 further includes penetration tunnel 529 which delivers the gas to the connection pipe 550 in order to deliver the gas to next the gas supply pipe 500. In one embodiment, the cross section of the penetration tunnel 529 is substantially inversely proportional to the distance over which the gas is delivered, e.g., the length of the penetration tunnel 529. Thus, the farther the penetration tunnel 529 is positioned from the connection pipe 550, the smaller the cross section of the penetration tunnel 529 is, thereby substantially uniformly supplying the gas to all the gas supply pipes 500. Therefore, the gas supply pipe 500 includes the connection pipe 550 and the first inner pipe 520 having the penetration tunnel 529, thereby lengthening the gas supply pipes 500 and substantially uniformly supplying the gas over wide area.

Although the above description refers to the target and the stage as horizontally arranged with respect to the ground, the target and the stage can be vertically arranged with respect to the ground, depending on the embodiment. Also, although the above description describes the exhaust pump as including a turbo molecular pump (TMP), the exhaust pump can include various types of pumps in place of the TMP.

The described technology can be applied to sputtering devices for various purposes. For example, the described technology can be applied to the sputtering device for forming an oxide semiconductor layer, for forming a display device, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive technology. Accordingly, all such modifications are intended to be included within the scope of the present invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A sputtering device, comprising:

a chamber;

a stage located in the chamber and configured to receive a substrate thereon;

a plurality of gas supply pipes arranged substantially parallel to each other, wherein the gas supply pipes have a plurality of gas supply holes and wherein the gas supply pipes are configured to supply gas into the chamber; and at least one exhaust pump placed at a side of the chamber, wherein the exhaust pump is substantially symmetrically arranged with respect to a center axis of the side of the chamber, wherein each of the gas supply pipes comprises a plurality of inner pipes, wherein each inner pipe has at least one hole formed on a surface thereof, and wherein the holes of the inner pipes of the same gas supply pipe are respectively connected to each other.

2. The sputtering device of claim 1, wherein at least one target opposing the stage is interposed between the exhaust pump and the stage.

3. The sputtering device of claim 2, wherein the gas supply pipes are interposed between the target and the stage.

4. The sputtering device of claim 3, wherein the gas supply pipes are configured to emit the gas toward the target or the stage.

5. The sputtering device of claim 2, wherein the at least one target comprises a plurality of targets and wherein the gas supply pipes are alternately arranged with the targets.

6. The sputtering device of claim 2, wherein the gas supply pipes are located behind the stage and are configured to emit the gas toward the stage and wherein the target is interposed between the gas supply pipes and the stage.

7. The sputtering device of claim 1, wherein each of the gas supply pipes comprises:

a first inner pipe including a plurality of gas tunnels formed on a surface of the first inner pipe, wherein a plurality of first holes are formed in a substantially straight line on the surface of the first inner pipe, wherein the first holes are respectively connected to the gas tunnels, and wherein the cross sectional areas of the gas tunnels are substantially proportional to the lengths of the gas tunnels;

a third inner pipe having one or more third holes connected to the first holes and configured to receive the gas from the first holes; and a fourth inner pipe having a plurality of fourth holes connected to the third holes and configured to i) receive the gas from the third holes and ii) emit the received gas.

8. The sputtering device of claim 7, wherein each of the gas supply pipes further comprises a second inner pipe which interposed between the first inner pipe and the third inner pipe and wherein each of the second inner pipes has a plurality of second holes respectively connected to the first holes.

9. The sputtering device of claim 8, wherein each of the first, second, third, and fourth inner pipes is formed of one or more of aluminum oxide ($Al_2O_3$), SUS304 stainless steel, hard anodized aluminum, titanium (Ti), and ceramics.

10. The sputtering device of claim 7, wherein the number of the third holes equals the number of the first holes, wherein the third holes are respectively connected to the first holes, and wherein the areas of the third holes are greater than the areas of the first holes.

11. The sputtering device of claim 1, wherein the gas supply pipes are electrically connected to a ground voltage.

12. The sputtering device of claim 1, wherein the gas supply pipes are electrically connected to a DC power supply voltage or an AC power supply voltage.

13. A gas supply pipe for a sputtering device, comprising:

a first inner pipe including a plurality of gas tunnels formed on a surface of the first inner pipe, wherein a plurality of first holes are formed in a substantially straight line, wherein the first holes are respectively connected to the gas tunnels, and wherein the cross sectional areas of the gas tunnels are substantially proportional to the lengths of the gas tunnels;

a third inner pipe having one or more third holes connected to the first holes and configured to receive a gas from the first holes; and a fourth inner pipe having a plurality of fourth holes connected to the third holes and configured to i) receive the gas from the third holes and ii) emit the received gas.

14. The gas supply pipe of claim 13, further comprising a second inner pipe interposed between the first inner pipe and the third inner pipe, wherein the second inner pipe has a plurality of second holes respectively connected to the first holes.

15. The gas supply pipe of claim 13, wherein the cross section of each of the gas tunnels has a substantially circular shape and wherein the gas tunnels satisfy Equation 1:

$$\frac{d_1^3}{l_1} = \frac{d_2^3}{l_2} = k \quad \text{[Equation 1]}$$

where $d_1$ is the diameter of a first one of the gas tunnels, $l_1$ is the length of the first one of the gas tunnels, $d_2$ is the diameter of a second one of the gas tunnels, $l_2$ is the length of the second one of the gas tunnels, and k is a constant.

16. The gas supply pipe of claim 13, further comprising a connection pipe connected to an end of the fourth inner pipe, wherein the first inner pipe further includes a penetration tunnel arranged along a center axis of the first inner pipe and configured to deliver the gas to the connection pipe.

17. The gas supply pipe of claim 16, wherein the cross sectional area of the penetration tunnel is substantially inversely proportional to the length of the penetration tunnel.

18. A sputtering device, comprising:

a chamber;

a stage located in the chamber and configured to receive a substrate thereon; and a plurality of gas supply pipes located in the chamber and arranged substantially parallel to each other, wherein each of the gas supply pipes comprises a plurality of inner pipes, wherein each inner pipe has at least one hole formed on a surface thereof, and wherein the holes of the inner pipes of the same gas supply pipe are respectively connected to each other.

19. The sputtering device of claim 18, wherein the inner pipes of each of the gas supply pipes comprise a first inner pipe including a plurality of gas tunnels formed on the surface thereof and wherein the cross sectional areas of the gas tunnels are substantially proportional to the lengths of the gas tunnels.

20. The sputtering device of claim 19, wherein the holes of each the inner pipes of the same supply pipe have different areas from each other.

* * * * *